(12) United States Patent
Fell

(10) Patent No.: US 10,422,642 B2
(45) Date of Patent: Sep. 24, 2019

(54) STRAIN DECOUPLED SENSOR

(71) Applicant: Atlantic Inertial Systems Limited, Plymouth (GB)

(72) Inventor: Christopher Paul Fell, Devon (GB)

(73) Assignee: Atlantic Inertial Systems Limited, Plymouth (GB)

(*) Notice: Subject to any disclaimer, the term of this patent is extended or adjusted under 35 U.S.C. 154(b) by 0 days.

(21) Appl. No.: 15/399,949

(22) Filed: Jan. 6, 2017

(65) Prior Publication Data

US 2017/0115117 A1    Apr. 27, 2017

Related U.S. Application Data

(63) Continuation of application No. 14/369,874, filed as application No. PCT/GB2013/050006 on Jan. 4, 2013, now Pat. No. 9,541,395.

(30) Foreign Application Priority Data

Jan. 5, 2012 (GB) .................................. 1200128.5

(51) Int. Cl.
  *G01C 19/5783* (2012.01)
  *B81B 7/00* (2006.01)
  (Continued)

(52) U.S. Cl.
  CPC ........ *G01C 19/5783* (2013.01); *B81B 3/0021* (2013.01); *B81B 7/0048* (2013.01); *G01C 19/5684* (2013.01); *B81B 2201/0242* (2013.01)

(58) Field of Classification Search
  CPC ............ G01C 19/5783; G01C 19/5684; B81B 7/0048; B81B 2201/0242
  See application file for complete search history.

(56) References Cited

U.S. PATENT DOCUMENTS

| 6,137,170 A | 10/2000 | Ujiie et al. |
| 6,282,958 B1 | 9/2001 | Fell |

(Continued)

FOREIGN PATENT DOCUMENTS

| CN | 1701438 | 11/2005 |
| CN | 102089620 | 6/2011 |

(Continued)

OTHER PUBLICATIONS

Office Action dated Apr. 5, 2016 in Chinese Application No. 201380004817.X.

(Continued)

*Primary Examiner* — Brett A Feeney
*Assistant Examiner* — Vincent Wall
(74) *Attorney, Agent, or Firm* — Snell & Wilmer, L.L.P.

(57) ABSTRACT

A sensor comprises a substrate 16 and a sensor element 20 anchored to the substrate 16, the substrate 16 and sensor element 20 being of dissimilar materials and having different coefficients of thermal expansion, the sensor element 20 and substrate 16 each having a generally planar face arranged substantially parallel to one another, the sensor further comprising a spacer 26, the spacer 26 being located so as to space at least part of the sensor element 20 from at least part of the substrate 16, wherein the spacer 26 is of considerably smaller area than the area of the smaller of face of the substrate 16 and that of the sensor element 20.

14 Claims, 4 Drawing Sheets

(51) Int. Cl.
    *G01C 19/5684*     (2012.01)
    *B81B 3/00*     (2006.01)

(56) References Cited

U.S. PATENT DOCUMENTS

| | | | |
|---|---|---|---|
| 6,787,804 B1 | 9/2004 | Yang | |
| 2003/0038415 A1* | 2/2003 | Anderson | F16F 1/18 267/160 |
| 2004/0041254 A1* | 3/2004 | Long | B81B 7/0048 257/703 |
| 2004/0144174 A1* | 7/2004 | Fell | G01C 19/5684 73/504.12 |
| 2005/0035446 A1* | 2/2005 | Karpman | B81B 7/0048 257/711 |
| 2010/0030020 A1 | 2/2010 | Ge et al. | |
| 2010/0072563 A1 | 3/2010 | Sato et al. | |
| 2010/0251818 A1 | 10/2010 | Ge et al. | |
| 2011/0167911 A1 | 7/2011 | Fell | |

FOREIGN PATENT DOCUMENTS

| | | |
|---|---|---|
| EP | 1427988 | 7/2011 |
| GB | 2253739 | 9/1992 |
| JP | 2000249562 | 9/2000 |
| JP | 2006518673 | 8/2006 |
| JP | 2008516196 | 5/2008 |
| JP | 2011528103 | 11/2011 |
| WO | 2008069394 | 6/2008 |

OTHER PUBLICATIONS

Office Action dated Apr. 22, 2016 in Japanese Application No. 2014-550758.
International Search Report and Written Opinion dated May 3, 2013 in Application No. PCT/GB2013/050006.
Search report dated May 3, 2013 in United Kingdom Application No. GB1200128.5.
Office Action dated Jul. 17, 2015 in Chinese Application No. 201380004817.X.
European Search Report dated Oct. 5, 2015 in European Application No. 13700783.7.
Office Action dated Mar. 26, 2015 in U.S. Appl. No. 14/369,874.
Final Office Action dated Aug. 27, 2015 in U.S. Appl. No. 14/369,874.
Advisory Action dated Nov. 4, 2015 in U.S. Appl. No. 14/369,874.
Office Action dated May 9, 2016 in U.S. Appl. No. 14/369,874.
Notice of Allowance dated Oct. 5, 2016 in U.S. Appl. No. 14/369,874.
Communication pursuant to Article 94(3) EPC dated Sep. 26, 2016 in European Application No. 13700783.7.
Office Action dated Feb. 7, 2017 in Japanese Application No. 2014-550758.

\* cited by examiner

STRAIN DECOUPLED SENSOR

CROSS-REFERENCE TO RELATED APPLICATIONS

This application is a continuation of, claims priority to and the benefit of, U.S. Ser. No. 14/369,874 filed Jun. 30, 2014 and entitled "Strain Decoupled Sensor." The '874 application is a U.S. national phase filing under 35 U.S.C. § 371 of PCT Application No. PCT/GB2013/050006 filed Jan. 4, 2013 and entitled "Strain Decoupled Sensor." PCT/GB2013/050006 claims priority to and the benefit of United Kingdom Application No. GB 1200128.5 filed Jan. 5, 2012 and entitled "Strain Decoupled Sensor." All of the aforementioned applications are incorporated herein by reference in their entirety.

FIELD OF INVENTION

This invention relates to a sensor, and in particular to a sensor in which inaccuracies arising from thermally induced stresses are reduced.

BACKGROUND

Sensors are typically composed of a number of component parts at least some of which are of different materials and which are rigidly interconnected to one another. If the sensor is subject to a change in temperature, then thermal expansion or contraction of each component part will occur. Where the component parts have different coefficients of thermal expansion, as will often be the case where the component parts are of different materials, then stresses will typically be induced.

Micro-electromechanical systems (MEMS) technology has been used to create a number of sensor designs. For example, MEMS based accelerometers and gyroscopes are well known. Such devices typically comprise a substantially planar silicon layer anchored to a substrate of, for example, glass or silicon. Other components may also be anchored to the substrate, and differential thermal expansion, as mentioned above, between the said other components and the substrate may induce stresses in the silicon layer which, in turn, can impact negatively upon the operation of the sensor. For example, the bias or scale factor of the sensor may be impacted.

US2010/0072563 and WO2008/069394 describe sensor arrangements in which a sensor element is bonded to a substrate. In each case, the sensor element includes movable parts movable relative to fixed parts, and whilst only the fixed parts of the sensor element, not the entire surface of the sensor element, are bonded to the substrate, as several parts of the sensor element are bonded to the substrate, differential thermal expansion or contraction results in stresses being induced in the sensor element.

US2010/0251818 and US2010/0300201 describe an arrangement in which a resilient or compliant support is used to support a sensor element, accommodating differential thermal expansion.

US2003/0038415 describes a mounting arrangement for a sensor and which is compliant.

It is an object of the invention to provide a sensor in which the disadvantages outlined hereinbefore are overcome or are of reduced effect.

SUMMARY

According to the present invention there is provided a sensor comprising a substrate and a sensor element anchored to the substrate, the substrate and sensor element being of dissimilar materials and having different coefficients of thermal expansion, the sensor element and substrate each having a generally planar face arranged substantially parallel to one another, the sensor further comprising a single spacer whereby the sensor element is anchored to the substrate, the spacer being located so as to space at least part of the sensor element from at least part of the substrate, wherein the spacer is of considerably smaller area than the area of the smaller of the face of the substrate and that of the sensor element.

The spacer may be formed integrally with one or other, or both, of the sensor element and the substrate. Where the spacer is formed integrally with one of the sensor element and the substrate, it is conveniently bonded, for example using a suitable Epoxy, to the other of the sensor element and the substrate. It will be appreciated that the area of contact between the spacer and the said other of the sensor element and the substrate, ie the area of the spacer, is considerably smaller than the area of the face of that component.

As, in this arrangement, the sensor element and substrate are only interconnected over a small proportion of their areas, at the location of the spacer, stresses arising from differential thermal expansion of the sensor element and substrate are limited to those due to the small proportion of the areas at which they are interconnected, at the spacer, and so are of much reduced impact upon the operation of the sensor.

Conveniently, the spacer is formed integrally with the substrate. For example, it may be defined by a small diameter projection, upstanding from the surrounding part of the substrate. A cavity may be formed in the face of the substrate, the projection preferably being located at the centre of the cavity. The cavity is conveniently of annular form.

The projection is conveniently of generally cylindrical shape. However, other shapes are possible. For example, it could have a polygonal cross-section.

The spacer is conveniently of area less that half of the area of the substrate and/or sensor element. Preferably, the spacer area is less than 30% of the area of the substrate and/or sensor element.

The spacer preferably spaces the substrate and sensor element apart by a distance in the region of 30 μm. However, the invention is also applicable to other arrangements in which the spacing is, for example, greater. Indeed, a greater spacing such as in the region of, for example 300 μm, may be advantageous as it may attenuate stresses coupling across the spacer.

The sensor conveniently comprises a vibratory ring gyroscope. In such an arrangement, the sensor element conveniently comprises a part of a magnet assembly of the sensor. For example, it may comprise a lower pole piece of the magnet assembly. It will be appreciated, however, that the invention may be applied to other forms of sensor and, in such arrangements, the sensor element may be of other forms.

BRIEF DESCRIPTION OF THE DRAWINGS

The invention will further be described, by way of example, with reference to the accompanying drawings, in which.

DETAILED DESCRIPTION

Figure 1:
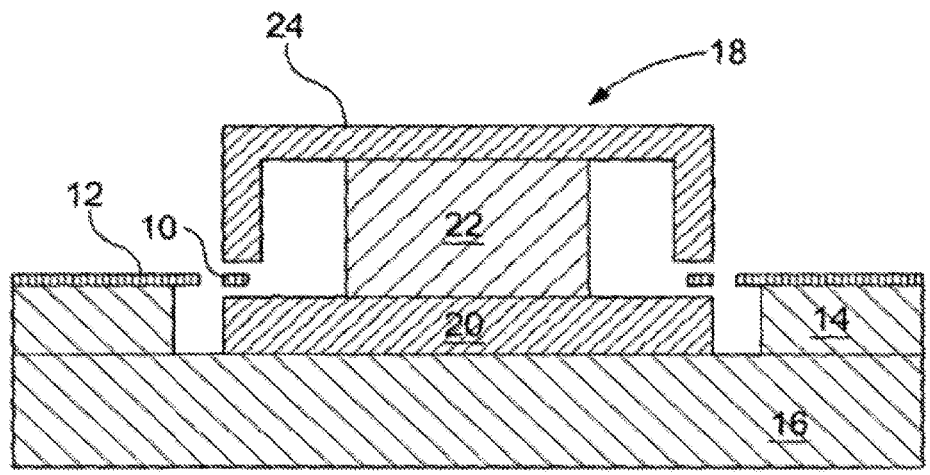
FIG. 1 is a diagrammatic representation of a known form of vibratory ring gyroscope.

Referring firstly to FIG. 1, a sensor is illustrated which comprises a ring shaped resonator 10 attached to a support frame 12 by integral support ligaments (not shown in FIG. 1) that extend outwards from the resonator 10. The support frame 12 is mounted upon a glass pedestal 14 which, in turn, is mounted upon a glass substrate 16.

Attached to the substrate 16 is a magnet assembly 18 made up of a lower pole piece 20, an upper pole piece 24, and a magnet 22 located therebetween. The magnet assembly 18, in particular the lower pole piece 20 thereof, is attached to the glass substrate 16 by a thin, substantially rigid layer of adhesive located between the lower pole piece 20 and the glass substrate 16. The lower pole piece 20 is thus secured, over its entire lower surface, to the substrate 16. The lower pole piece 20 is typically of a suitable ferromagnetic material which has a relatively low coefficient of thermal expansion. The pole piece 20 may have a coefficient of thermal expansion of the order of $7 \times 10^{-6}$. The coefficients of thermal expansion of silicon and Pyrex glass are in the region of $3 \times 10^{-6}$ and $2 \times 10^{-6}$, respectively. Typically, the adhesive is applied at an elevated temperature, for example in the region of 130° C. As the assembly cools from this temperature, differential thermal expansion/contraction occurs between the lower pole piece 20 and the substrate 16, inducing stresses therein and in the resonator 10 and support frame 12 as mentioned hereinbefore. Temperature changes during use will also induce stresses for the same reason.

The support frame 12, pedestal 14 and substrate 16 are typically of generally square cross-sectional shape, the pedestal 14 including an inner opening of generally circular cross-sectional shape within which the magnet assembly 18, which is of generally cylindrical shape, is located. As a result, the stress distribution within the sensor is non-uniform, having maxima where the width of the pedestal 14 is smallest, and minima at the corners where the width of the pedestal 14 is greatest. This varying stress pattern is coupled into the resonator 10 through the ligaments by which it is mounted to the support frame 12, varying the stiffness of the resonator.

Figure 3:
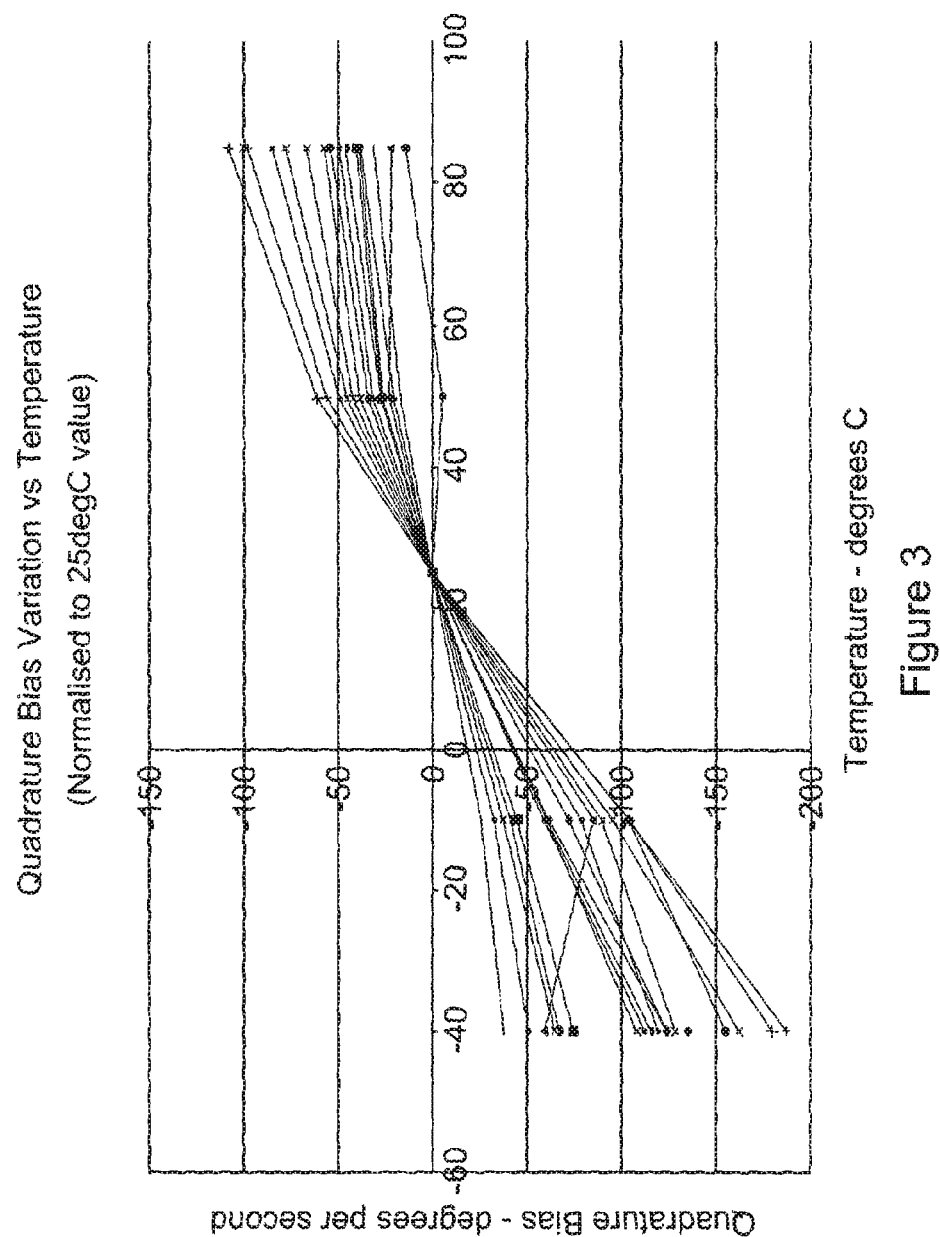
FIG. 3 is a graph illustrating the quadrature bias variation with temperature for thirty samples of a typical sensor.

It will be appreciated by one skilled in the art that the coupling of this varying stress pattern into the resonator impacts upon the operation of the sensor. The applicant believes that variations arising from these thermally induced stresses are the primary cause of quadrature bias variations, as would be understood by a man skilled in the art. FIG. 3 is a graph illustrating quadrature bias variations resulting from temperature changes, and it will be appreciated that these are quite significant, and so will impact upon the use of the sensor.

Figure 2:
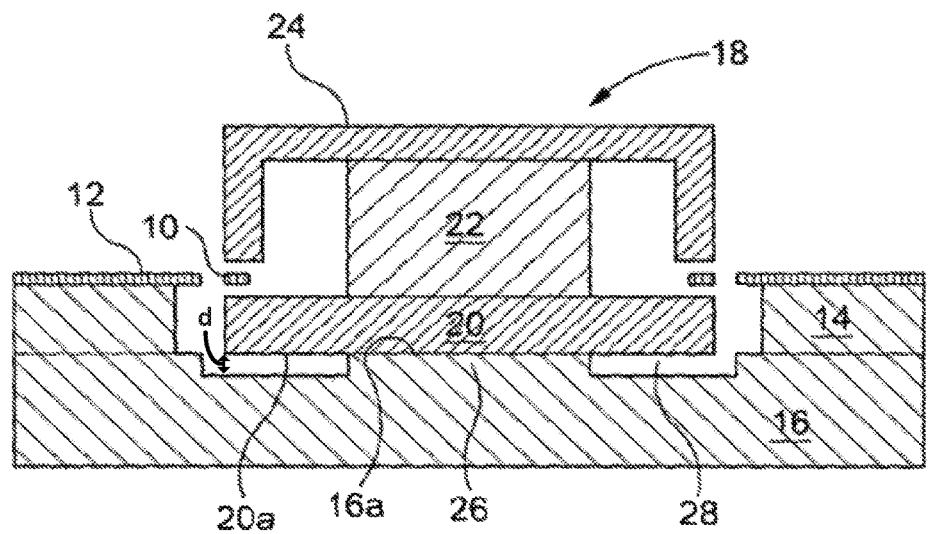
FIG. 2 is a view similar to FIG. 1 but illustrating a sensor in accordance with one embodiment of the invention.

FIG. 2 illustrates a sensor in accordance with an embodiment of the invention. The sensor of FIG. 2 is very similar to that of FIG. 1 and so only the differences therebetween will be described in detail below. Where appropriate, the description hereinbefore can be referred to to aid understanding of the embodiment of FIG. 2. Like reference numerals are used in FIGS. 1 and 2 to denote parts which are similar or perform substantially the same function.

Figure 5:
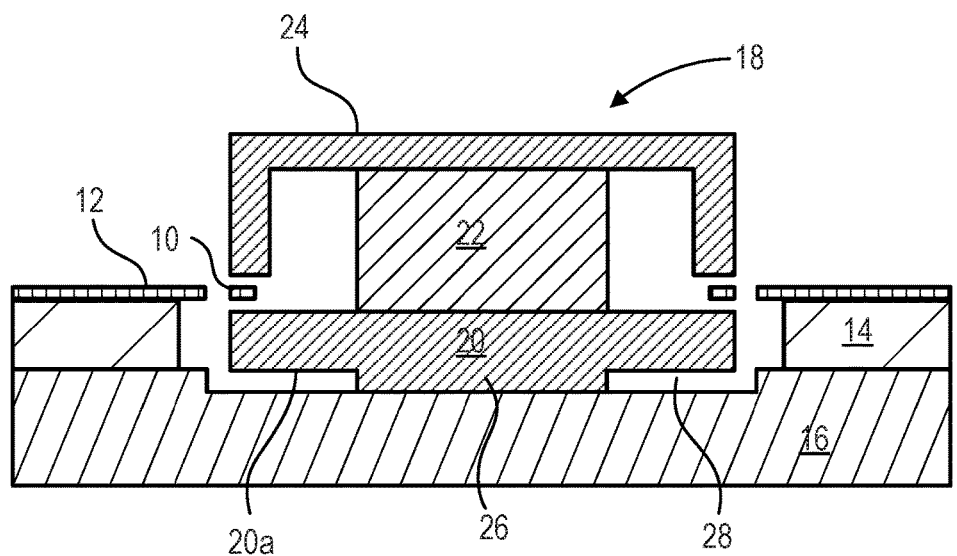
FIG. 5 is a view similar to FIG. 2 but illustrating a spacer integrally formed with a lower pole piece in accordance with one embodiment of the invention.
Figure 6:
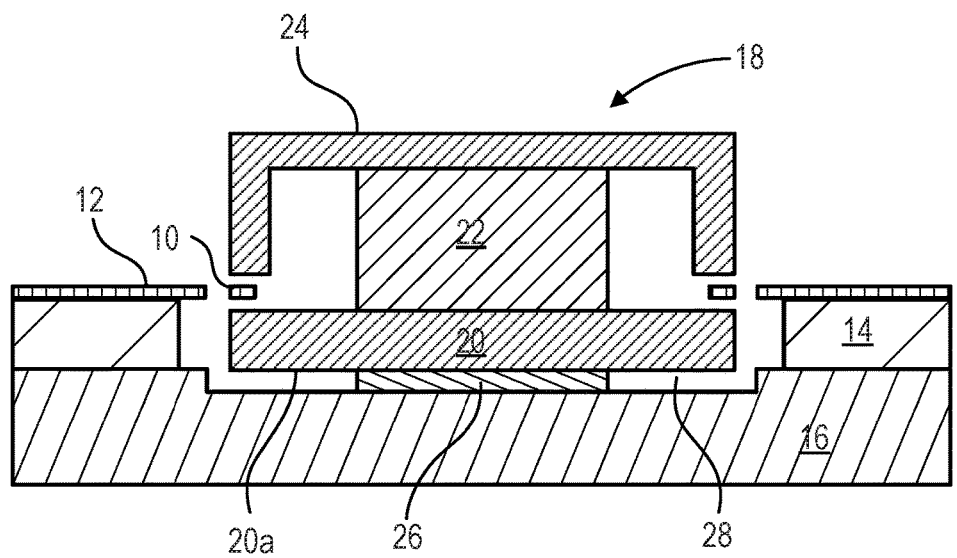
FIG. 6 is a view similar to FIG. 2 but illustrating a spacer as a separate component in accordance with one embodiment of the invention.

In the sensor of FIG. 2, the underside or lower face 20a of the lower pole piece 20 does not engage the substrate 16 over substantially its complete area. Rather, the majority of the lower face 20a is spaced apart from the substrate 16 by a small distance d. Distance d may, for example, be of the order of 30 µm. As illustrated, this is achieved by virtue of the presence of a spacer 26. In the embodiment of FIG. 2, the spacer 26 is integrally formed with the substrate 16. However, arrangements may be possible in which the spacer 26 forms part of the lower pole piece 20 as illustrated in FIG. 5 for example, or is a separate component, as illustrated in FIG. 6 for example. Furthermore, the spacer could be of two part form, part of the spacer being formed on the substrate and another part thereof being formed on the lower pole piece.

Whilst in the arrangement described hereinbefore the distance d is of the order of 30 µm, it will be appreciated that other spacings may be used without departing from the scope of the invention. Indeed, greater spacings such as, for example, 300 µm, may be advantageous as they may result in some attenuation of the stresses coupling across the spacer. To some extent, the depth will be governed by the technique used to form the spacer and the structural integrity of the spacer and the remainder of the substrate.

The spacer 26 is conveniently formed by etching a shallow recess or cavity 28 into a surface 16a of the substrate 16. Other manufacturing techniques may be used. For example, powder blasting techniques may be used. Typically, etching will result in the formation of a relatively shallow recess, powder blasting being appropriate where a deeper recess is desired. The recess or cavity 28 is of generally annular form, having an outer diameter slightly larger than the diameter of the lower pole piece 20, the spacer 26 being formed or defined by the centre of the annular recess or cavity 28. The spacer 26 thus projects from the centre of the recess or cavity 28 to substantially the plane of the surface 16a.

As with the sensor of FIG. 1, during assembly, the lower pole piece 20 is secured to the substrate 16, for example by the use of a suitable epoxy. Unlike the sensor of FIG. 1, however, only part of the lower face 20a of the lower pole piece 20 is fixed to the substrate 16, the said part of the lower face 20a being fixed to the spacer 26. The remainder of the lower face 20a of the lower pole piece 20 is suspended or spaced from the substrate 16 by virtue of the presence of the recess or cavity 28 and the spacer 26. The area of contact between the sensor element 20 and the substrate 16 is this limited to the area of the spacer 26.

As only a relatively small part of the surface area of the lower pole piece 20 is in contact with, and secured to, the substrate 16, it will be appreciated that differential thermal expansion or contraction only results in the imparting or inducing of limited stresses into the assembly. Coupling of thermally induced stresses into the resonator 10 is thus much reduced, leading to enhancements in the operation and sensitivity of the sensor.

By way of example, in the arrangement illustrated, the lower pole piece 20 is of diameter approximately 6 mm, the recess or cavity is slightly larger than the pole piece 20, and the spacer 26 is of diameter approximately 3 mm. It will be appreciated, therefore, that in this embodiment the area of contact between the lower pole piece 20 and the substrate 16 (ie the area of the spacer 26) is approximately 25% of the equivalent contact area of the arrangement of FIG. 1. Whilst in this embodiment the contact area is reduced to 25% of the equivalent area of the arrangement of FIG. 1, it will be appreciated that the invention is not restricted in this regard. For example, some of the benefits of the invention would arise by reducing the contact area to less than, approximately, 50% of the area of the lower pole piece 20. However, preferably, the contact area is less than this, conveniently less than approximately 30% of the area of the lower pole piece 20. It will be appreciated that, in practise, there is a trade-off between minimising the contact area to reduce the coupling of thermally induced stresses into the resonator 10, and ensuring that the lower pole piece 20 is properly supported and secured in position on the substrate 16.

Figure 4:
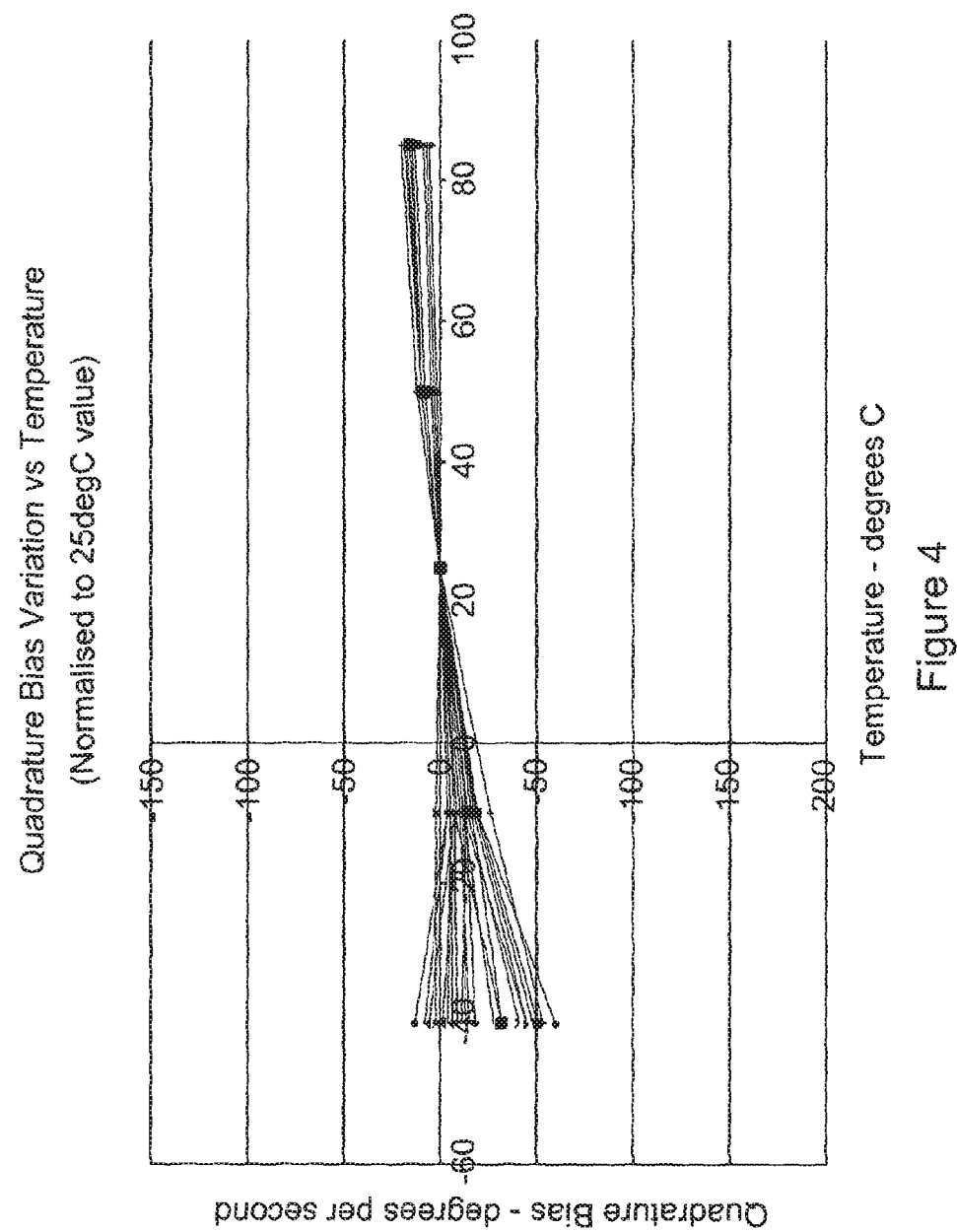
FIG. 4 is a graph similar to FIG. 3 showing the quadrature bias variation of samples of a sensor in accordance with an embodiment of the invention.

FIG. 4 is a graph similar to FIG. 3, and to substantially the same scale, but illustrating the quadrature bias variations of the embodiment of FIG. 2 as described hereinbefore. It will be noted, by comparing the graphs of FIGS. 3 and 4, that the quadrature bias variations with temperature of the arrangement of FIG. 2 are much reduced.

The arrangement of the invention not only achieves a reduction in the coupling of thermally induced stresses into the resonator, and so reduces the negative effects thereof, but also achieves this result in a relatively simple and convenient manner, involving the introduction of just a single additional manufacturing step to form the cavity 28.

In the arrangements described hereinbefore, the lower pole piece 20 forms the sensor element which is secured to the substrate 16. However, it will be appreciated that in other forms of sensor, the sensor element may take other forms. The invention is not restricted in this regard.

A wide range of modifications and alterations may be made to the arrangements described hereinbefore without departing from the scope of the invention as defined by the appended claims. For example, in the arrangement described the spacer 26 is formed at the centre of the recess or cavity 28 28 and is of generally cylindrical form. However, other shapes and locations could be employed, if desired.

What is claimed is:

1. A vibratory ring gyroscope, comprising:
   a substrate;
   a ring shaped resonator;
   a magnet assembly comprising a sensor element anchored to the substrate, the substrate and sensor element being of dissimilar materials and having different coefficients of thermal expansion, the sensor element and substrate each having a generally planar face arranged substantially parallel to one another, and
   a single spacer whereby the sensor element is anchored upon the substrate, the spacer being located so as to space at least part of the sensor element from at least part of the substrate,
   wherein a face of the spacer is of area less than half of the area of the substrate and less than half of the area of the sensor element.

2. A vibratory ring gyroscope according to claim 1, wherein the spacer is formed integrally with one or other of the sensor element and the substrate.

3. A vibratory ring gyroscope according to claim 2, wherein the spacer is bonded to the other of the sensor element and the substrate.

4. A vibratory ring gyroscope according to claim 1, wherein the spacer is formed integrally with the substrate.

5. A vibratory ring gyroscope according to claim 4, wherein the spacer is defined by a projection, protruding from the surrounding part of the substrate.

6. A vibratory ring gyroscope according to claim 5, wherein a cavity is formed in the face of the substrate, the spacer protruding from the base of the cavity.

7. A vibratory ring gyroscope according to claim 6, wherein the projection is located at the centre of the cavity.

8. A vibratory ring gyroscope according to claim 7, wherein the cavity is of annular form.

9. A vibratory ring gyroscope according to claim 5, wherein the projection is of generally cylindrical shape.

10. A vibratory ring gyroscope according to claim 1, wherein the spacer is of area less than 30 percent of the area of the smaller of the substrate and the sensor element.

11. A vibratory ring gyroscope according to claim 1, wherein the spacer spaces the substrate and sensor element apart by a distance comprising at least 30 microns.

12. A vibratory ring gyroscope according to claim 1, wherein the sensor element is a lower pole piece of the magnet assembly.

13. A vibratory ring gyroscope according to claim 12, wherein the magnet assembly further comprises:
   an upper pole piece; and
   a magnet located between the upper pole piece and the lower pole piece.

14. A vibratory ring gyroscope according to claim 1, wherein the resonator is mounted upon the substrate independently from the spacer.

* * * * *